United States Patent [19]
Cabot

[11] Patent Number: 5,247,458
[45] Date of Patent: Sep. 21, 1993

[54] METHOD AND APPARATUS FOR TESTING A DIGITAL SYSTEM FOR THE OCCURRENCE OF ERRORS

[75] Inventor: Richard C. Cabot, Portland, Oreg.

[73] Assignee: Audio Precision, Inc., Beaverton, Oreg.

[21] Appl. No.: 580,754

[22] Filed: Sep. 11, 1990

[51] Int. Cl.⁵ ............................................. G06F 11/00
[52] U.S. Cl. .................................. 364/550; 371/25.1
[58] Field of Search ............. 364/487, 550, 553, 574; 371/25.1, 30

[56] References Cited

U.S. PATENT DOCUMENTS

| | | | |
|---|---|---|---|
| 3,764,995 | 10/1973 | Helf, Jr. et al. | 371/25.1 X |
| 3,912,880 | 10/1975 | Powter et al. | 381/58 X |
| 3,976,940 | 8/1976 | Chau et al. | 371/25.1 |
| 4,055,801 | 10/1977 | Pike et al. | 371/25.1 |
| 4,092,589 | 5/1978 | Chau et al. | 371/25.1 |
| 4,318,128 | 3/1982 | Sauvanet | 307/359 X |
| 4,351,062 | 9/1982 | Yoshiya | 364/576 X |
| 4,352,182 | 9/1982 | Billi et al. | 381/58 X |
| 4,706,290 | 11/1987 | Lin | 381/58 |
| 4,709,395 | 11/1987 | Fischer et al. | 371/30 X |
| 4,773,094 | 9/1988 | Dolby | 381/58 |
| 4,855,930 | 8/1989 | Chao et al. | 364/554 X |
| 5,168,216 | 12/1992 | Dance | 371/25.1 X |

*Primary Examiner*—Edward R. Cosimano
*Attorney, Agent, or Firm*—William A. Birdwell & Associates

[57] ABSTRACT

A method and apparatus for testing a digital signal processing system for the occurrence of bit errors. A mathematically-predictable test signal is applied to the input of a digital signal processing system. The test signal components are removed from the output signal of the system by filtering, curve fitting or other techniques, leaving a resultant signal. The peak amplitude of the resultant signal is measured as an indication of the occurrence of errors. A time integrated measure of the resultant signal is made as an indication of the amount of noise and distortion artifacts. The peak amplitude is compared to a reference or the time integrated measure to identify errors. A histogram of the resultant signal amplitude may also be produced.

29 Claims, 2 Drawing Sheets

METHOD AND APPARATUS FOR TESTING A DIGITAL SYSTEM FOR THE OCCURRENCE OF ERRORS

BACKGROUND OF THE INVENTION

This invention relates to testing methods and apparatuses for digital signal processing systems, particularly to methods and apparatuses for testing a digital signal processing system for the occurrence of errors. The term "digital signal processing system" as used herein is intended to include systems for digital signal processing, transmission, recording and other digital systems that perform similar functions.

In testing digital signal processing systems it is ordinarily desirable to determine whether or not an error in a digital bit transmitted by the system has occurred over a selected period of time, that is the "error rate."

The conventional method for testing digital signal processing systems is to apply a pseudo random data pattern signal to the input of the system and examine the pattern of the output signal in comparison to the input signal to determine whether they match. This allows very sensitive testing, since an error in any bit can be identified. Pseudo random data patterns permit examination of all possible codes of the system under test, and will simulate the dynamic characteristics of a signal of the type normally applied to the system.

While the pseudo random data pattern is ideal for testing many digital signal transmission systems, it will not work with systems that introduce any signal processing, that is, where the transfer function of the system is unknown or variable. This is because it is difficult, if not impossible, to predict with sufficient accuracy what the effect of a particular adjustment of the system will be on the transfer function. For example, some digital audio mixing consoles will not pass digital signals without some modification, no matter how carefully the controls are adjusted. This may be due to many reasons, such as inadequate resolution in fader settings, a high pass filter in the data path, or the presence of equalizers. On the other hand, a digital telephone transmission system typically has a predictable, fixed transfer function when it is properly operating, so it can be tested using pseudo random data.

Some manufacturers of audio digital signal transmission systems provide their equipment with test routines that fix the adjustments in a known way so that the input can be compared to the output. However, such routines do not permit testing under normal operating conditions, and they require the addition of special purpose hardware or software to the system just for testing, which increases the cost of the system.

Accordingly, it would be desirable to have, and there is a need for, a method and apparatus that will determine in a digital signal processing system whose transfer function is unpredictable, whether or not a processing error has occurred, when it has occurred, and what the rate of processing errors is.

SUMMARY OF THE INVENTION

The present invention satisfies the aforementioned desire and need for a method and apparatus that can be used to test for data errors in a digital signal processing system whose transfer function is unknown by applying a mathematically-predictable test signal to the input of the processing system, removing the test signal components from the output signal so as to produce a resultant signal comprising noise and distortion artifacts, and comparing the instantaneous, or peak, output amplitude of the resultant signal to a time integrated measure of the resultant signal amplitude to determine whether or not an error has occurred.

A signal source is provided for supplying a mathematically-predictable test signal to the input of a digital signal processing system under test. Preferably, the test signal is a sinewave. A like signal is subtracted from the output of the processing system so as to leave a resultant signal comprised of noise and other distortion artifacts. The instantaneous, or peak, amplitude of the resultant signal is measured as an indication of the occurrence of an error. A time integrated measure of the resultant signal amplitude, such as the RMS or a weighted average amplitude, is also taken as an indication of the combined amount of noise and distortion. The peak amplitude is compared to a reference amplitude, preferably the aforementioned time integrated measure of signal amplitude, to determine whether or not an error has occurred. An error is considered to have occurred if the ratio of the peak amplitude to the reference amplitude exceeds a predetermined amount. The number of errors that occur during a selected time period is counted in order to determine the error rate. Also, the time of occurrence of a given error may be recorded.

A signal, preferably like the test signal, is subtracted from the output signal by the use of one or more digital notch filters. For example, the effect of simple nonlinearites in the system under test on a multiple sinewave test signal may be counteracted by using notch filters tuned to each original sinewave frequency and each significant harmonic and intermodulation frequency. Alternatively, a curve which is mathematically the same as the test signal is fit to the output signal data and subtracted therefrom digitally. The output signal may also be converted to analog form so that an analog notch filter or signal may be employed to remove the test signal from the output signal.

The peak amplitude of the resultant signal may be measured with a peak-reading meter, but preferably is digitally computed. Similarly, the time integrated measure of the amplitude of the resultant signal may be taken with an averaging or RMS meter, but preferably is digitally computed. In addition, the ratio of the peak to the time integrated measure of amplitude is preferably digitally computed and compared to a standard to identify the occurrence of an error. A histogram showing the number of occurrences of each value of the resultant signal as a function of its amplitude may also be used as a convenient way to assess system errors.

Accordingly, it is a principal objective of the present invention to provide a novel and improved method and apparatus for measuring errors that occur in a digital signal processing system.

It is another objective to provide a method and apparatus for measuring errors in a digital signal processing system where the transfer function of the system is unpredictable.

It is a further objective to provide a method and apparatus for determining the rate at which errors occur in a digital signal processing system.

It is yet a further objective to provide a method and apparatus that records the time when an error occurs in a digital signal processing system.

It is yet another objective to provide a method and apparatus for producing a histogram representing the occurrence of errors in a digital signal processing system.

The foregoing and other objectives, features, and advantages of the invention will be more readily understood upon consideration of the following detailed description of the invention, taken in conjunction with the accompanying drawings.

DESCRIPTION OF THE PREFERRED EMBODIMENT

Figure 1:
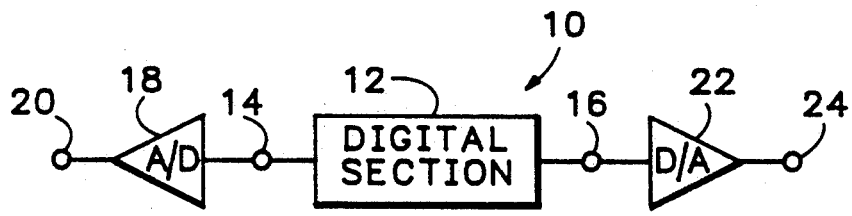
FIG. 1 is a representation of a generic digital signal processing system.
Figure 2:
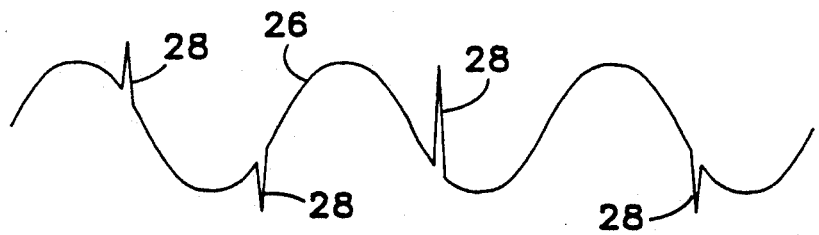
FIG. 2 is a graph of digital signal processing system output amplitude as a function of time, showing the effect of bit errors.

Referring first to FIG. 1, a generic digital signal processing system 10 is essentially a digital signal processing section 12, having an input port 14 for accepting a digital input signal and an output port 16 for producing a digital output signal. In addition, the system may also have an analog-to-digital converter 18 for accepting an analog input signal at analog input port 20, and a digital-to-analog converter 22 for providing an analog output signal at analog output port 24. Assuming that an essentially pure sinewave is applied to an input port of the system 10, and that the digital section produces bit transmission errors, a typical output signal could appear as shown in FIG. 2. The output signal comprises a sinewave component 26 like the input signal, plus noise and artifacts 28 produced by the bit transmission errors. As shown by FIG. 1, the input and output signals may be either in analog or digital form.

Figure 3:
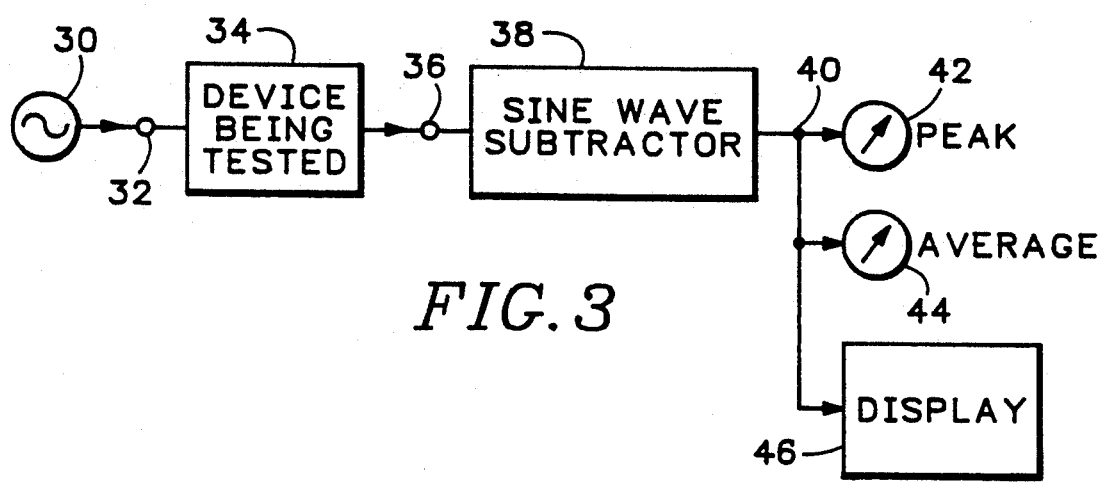
FIG. 3 is a functional block diagram of an apparatus according to the present invention.

Turning now to FIG. 3, a signal source 30 provides a test signal to an input port 32 of the device being tested 34, which provides an output signal at output port 36. The device being tested is a digital processing system 10 which may have or employ any combination of an analog input port 20 or a digital input port 14 and an analog output port 24 or a digital output port 16. If the device being tested 34 employs a digital input port, then signal source 30 must provide a digitized test signal; if the device 34 employs an analog input, then the signal source 30 must provide an analog test signal. In either case, the test signal must be a mathematically-predictable signal, that is, one which produces at the output of the system under test a mathematically-predictable waveform under normal operating conditions. Preferably a sinewave test signal is used.

Figure 4:
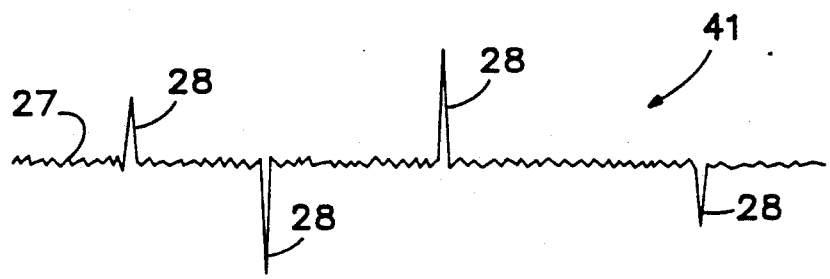
FIG. 4 is a graph of signal amplitude as a function of time for a digital signal processing system output signal from which a sinewave signal has been subtracted leaving a resultant difference signal having noise and distortion artifacts.

According to the principles of the present invention, a sinewave subtracter 38 is connected to the output 36 of the device 34. The subtracter 38 removes the sinewave component 26 from the output signal, illustrated by FIG. 2. The sinewave subtracter 38 produces at its output 40 a difference signal 41, as illustrated by FIG. 4.

The difference signal has only a noise component 27 and distortion artifacts 28. While a sinewave is the preferred form of test signal, it is to be recognized that other mathematically-predictable test signals and corresponding subtracters could be employed without departing from the principles of the present invention.

The sinewave subtracter may provide either a digital or an analog signal at output 40. In either case, the instantaneous, or peak, amplitude of the resultant difference signal 41 is measured and a time integrated measure, such as the RMS or a weighted average, amplitude of the difference signal is also measured. These measurements may be made by a peak reading meter 42 and an averaging meter 44, respectively, in the case of the analog difference signal. In this case, each time an error occurs the peak reading meter 42 deflects an amount proportional to the instantaneous amplitude of the difference signal, while the deflection of the averaging meter represents the average amplitude of the combined noise and distortion artifacts.

Errors may be identified and counted by observing the peak reading meter 42. An error would only be considered to have occurred if the instantaneous amplitude exceeds some reference level. While an absolute reference level might be used, a level relative to a time integrated measure of the noise and distortion artifacts is preferred. The comparison is made by computing the ratio of the peak amplitude to time-integrated-measure values and comparing the value of that ratio to some predetermined value. For example, if it is found that an error has most likely occurred anytime that the peak value exceeds twice the average value, then a ratio of greater than two would be an indication of the occurrence of an error. The number of errors that occur during a selected period of time can be counted to obtain the error rate, that is, the ratio of the number of errors during that period of time to the length of that period. In addition, the time when errors occur may also be noted, if needed.

Figure 6:
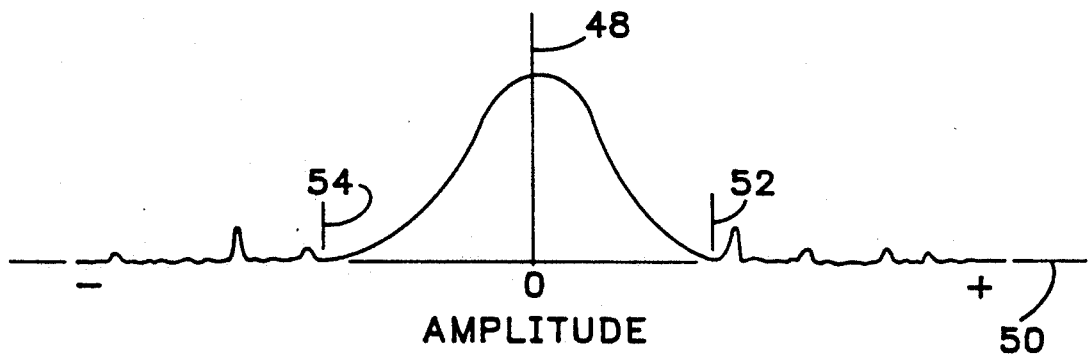
FIG. 6 is a histogram of the resultant difference signal, produced in accordance with the principles of the present invention.

In addition, the output 40 may be provided to a visual display 46 which produces a histogram, as illustrated by FIG. 6. The histogram comprises a graph of the number of occurrences of any given resultant signal amplitude, on the vertical axis 48, as a function of resultant signal amplitude, on horizontal axis 50. The histogram represents the statistical distribution of resultant amplitudes. The threshold amplitude for distinguishing an error from noise is found, on the positive side by line 52 and on the negative side by line 54; thence, peak amplitudes to the right of line 52 and to the left of line 54 indicate the occurrence of an error. The histogram facilitates visualization of the error characteristics of the digital signal processing system and makes the choice of reference amplitudes for identifying errors easier. While a histogram can be produced more easily where the difference signal is digital, it can also be produced from an analog signal, as is understood by persons skilled in the art.

The sinewave subtracter may be a digital or analog notch filter or, under limited conditions, it may be a device for subtracting the test signal produced by source 30 from the output signal of device 34, depending on the character of the resultant difference signal. Where the output signal is digital, a sinewave curve may be fit to the digital data representing the output signal, for example, by a least squares method, and then subtracted from the output signal. Other means for subtracting from the output signal a signal like the mathematically-predictable input signal may also be employed without departing from the principles of the present invention.

Figure 5:
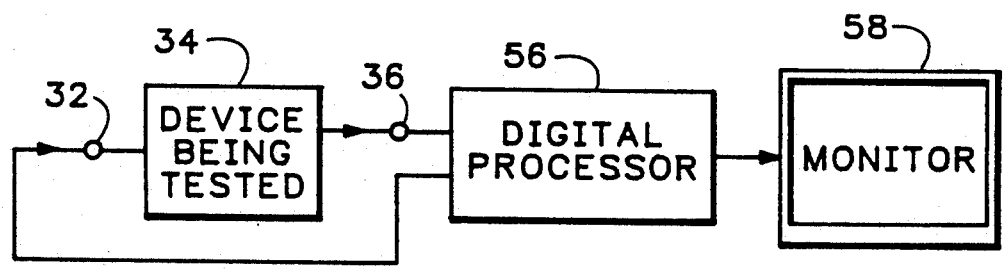
FIG. 5 is a block diagram of a preferred embodiment for realizing the present invention.

Preferably, the method and apparatus of the invention are implemented digitally, using a programmed digital processor 56, as illustrated in FIG. 5. In this preferred embodiment, the processor supplies a digitized sinewave signal to input port 32 of the device 34 being tested, and receives a digital output signal from output port 36 of the device. The sinewave subtracter may be implemented in various ways, as discussed previously, but it is preferably implemented by a digital notch filter tuned to the frequency of the input sinewave. The design and implementation in software of such a filter is commonly known to a person skilled in the pertinent art. In addition, it is preferred that the peak amplitude and the time integrated measure of the resultant difference signal, and their ratio, be determined digitally by the use of appropriate software. Likewise, the time that each error occurs may be recorded digitally automatically as is commonly known in the pertinent art, assuming that the processor has a clock. The error rate is also computed digitally. Finally, the same processor is programmed to produce a histogram. All of these results may be displayed on a computer monitor 58, as is commonly known in the art.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A method for testing a digital system for the occurrence of errors, said system having an input port for receiving an input signal and an output port for producing an output signal, comprising the steps of:
   (a) applying to said input port an input signal having known sinusoidal frequency components;
   (b) removing sinusoidal frequency components from said output signal of said system, thereby producing a resultant signal; and
   (c) thereafter identifying instances when the amplitude of said resultant signal exceeds a selected threshold, as an indication of the occurrence of an error.

2. The method of claim 1, further comprising the step of determining the number of occurrences of errors per unit time as a measure of error rate.

3. The method of claim 2, wherein said identifying step comprises measuring the peak amplitude of said resultant signal after removing sinusoidal frequency components from said output signal to identify the occurrence of an error, and said determining step comprises counting the number of such occurrence over a known period of time and computing the ratio of said number of such occurrences to said known period of time to determine said error rate.

4. The method of claim 1, further comprising the step of recording the time when an error occurs.

5. The method of claim 1, wherein said identifying step comprises recording the instantaneous amplitude of said resultant signal in the form of a histogram.

6. The method of claim 1, wherein said step of removing sinusoidal frequency components comprises selectively filtering said output signal.

7. The method of claim 6, wherein said filtering is accomplished using a digital filter.

8. The method of claim 1, wherein said step of removing sinusoidal frequency components comprises fitting a curve to said output signal, and subtracting said curve from said output signal to remove sinusoidal frequency components from said output signal.

9. The method any of claims 1 through 8, wherein said input port accepts a digital signal and said known sinusoidal frequency components are digitized.

10. The method of any of claims 1 through 8, wherein said output signal is digitized and said step of removing sinusoidal frequency components occurs in the digital domain.

11. The method of any of claims 1 through 8, wherein said output signal is digitized, further comprising the step of converting said output signal to an analog signal, and said identifying step comprises measuring the peak amplitude of said analog signal to identify the occurrence of an error.

12. The method of claim 11, wherein said identifying step further comprises the step of taking a time integrated measure of the amplitude of said analog signal and comparing said peak amplitude to said time integrated measure to identify the occurrence of an error.

13. The method of either of claims 1 or 2, wherein said identifying step comprises comparing the peak amplitude of said resultant signal to a fixed threshold to identify the occurrence of an error.

14. The method of either of claims 1 or 2, wherein said identifying step comprises comparing the peak amplitude of said resultant signal to a time integrated measure of resultant signal amplitude to identify the occurrence of an error.

15. An apparatus for testing a digital system for the occurrence of errors, said system having an input port for receiving an input signal and an output port for producing an output signal, comprising:
   (a) signal source means for applying to said input port an input signal having known sinusoidal frequency components;
   (b) subtractor means for removing sinusoidal frequency components from said output signal of said system, thereby producing a resultant signal; and
   (c) identifier means, responsive to said subtractor amplitude of said resultant signal exceeds a selected threshold, as an indication of the occurrence of an error.

16. The apparatus of claim 15, further comprising means for determining the number of occurrence of errors per unit time as a measure of error rate.

17. The apparatus of claim 16, wherein said identifier means comprises means for measuring the peak amplitude of said output signal after removing sinusoidal frequency components to identify the occurrence of an error, and said determining means comprises means for counting the number of such occurrences over a known period of time and means for outputting the ratio of said number of such occurrences to said known period of time to determine said error rate.

18. The apparatus of claim 15, further comprising means for recording the time when an error occurs.

19. The apparatus of claim 15, wherein said identifier means comprises means for recording the instantaneous amplitude of said resultant signal in the form of a histogram.

20. The apparatus of claim 15, wherein said subtraction means comprises filter means for filtering said output signal so as to selectively remove sinusoidal frequency components.

21. The apparatus of claim 20, wherein said subtracter means comprises a digital filter.

22. The apparatus of claim 15, wherein said subtraction means comprises means for fitting a sinusoidal curve to said output signal, and means for subtracting said curve from said output signal to remove sinusoidal frequency components from said output signal.

23. The apparatus of any of claims 15 through 22, wherein said input port accepts a digital signal and said known sinusoidal frequency components are digitized.

24. The apparatus of any of claims 15 through 23, wherein said output signal is digitized and said subtracter means comprises a digital filter.

25. The apparatus of any of claims 16 through 22, further comprising means for converting said output signal to an analog signal and said identifier means comprises means for measuring the peak amplitude of said analog signal to identify the occurrence of an error.

26. The apparatus of claim 25, wherein said identifier means further comprises means for taking a time integrated measure of the amplitude of said analog signal and means for comparing said peak amplitude to said time integrated measure to identify the occurrence of an error.

27. The apparatus of either of claims 15 or 16, wherein said identifier means comprises means for comparing the peak amplitude of said resultant signal to a fixed threshold to identify the occurrence of an error.

28. The apparatus of either of claims 15 or 16, wherein said identifier means comprises means for comparing the peak amplitude of said resultant signal to a time integrated measure of resultant signal amplitude to identify the occurrence of an error.

29. The apparatus of claim 15, wherein said subtracter means and said identifier means comprise a programmed digital computer.

* * * * *